United States Patent [19]

Bauerlein et al.

[11] 3,935,033

[45] Jan. 27, 1976

[54] METHOD OF IMPROVING THE RADIATION RESISTANCE OF SILICON TRANSISTORS WITH A SILICON OXIDE COATING

[75] Inventors: Rudolf Bauerlein; Dieter Uhl, both of Erlangen, Germany

[73] Assignee: Siemens Aktiengesellschaft, Berlin and Munich, Germany

[22] Filed: Nov. 15, 1973

[21] Appl. No.: 416,252

Related U.S. Application Data

[62] Division of Ser. No. 162,439, July 14, 1971, Pat. No. 3,829,961.

[30] Foreign Application Priority Data

July 18, 1970 Germany ........................... 2035703

[52] U.S. Cl. ...................... 148/1.5; 29/585; 357/91

[51] Int. Cl. ............................................. H01l 7/54

[58] Field of Search .............. 148/1.5; 29/584, 585; 357/91

[56] References Cited

UNITED STATES PATENTS

| | | | |
|---|---|---|---|
| 3,430,043 | 2/1969 | Blumenfeld et al. | 29/585 X |
| 3,570,112 | 3/1971 | Barry et al. | 29/585 X |

*Primary Examiner*—L. Dewayne Rutledge
*Assistant Examiner*—J. M. Davis
*Attorney, Agent, or Firm*—Herbert L. Lerner

[57] ABSTRACT

The radiation resistance of silicon transistors with a silicon oxide coating is improved by irradiating the semiconductor device with electrons at an energy below 150 keV and a dose between $10^9$ and $10^{12}$ rad at the boundary layer between the silicon and silicon oxide coating. The temperature of the semiconductor device is maintained at a temperature of between 150° and 450°C during irradiation thereof.

6 Claims, 4 Drawing Figures

METHOD OF IMPROVING THE RADIATION RESISTANCE OF SILICON TRANSISTORS WITH A SILICON OXIDE COATING

This is a division, of application Ser. No. 162,439, filed July 14, 1971, now U.S. Pat. No. 3,829,961.

DESCRIPTION OF THE INVENTION

The invention relates to a method of improving the radiation resistance of silicon transistors with a silicon oxide coating.

While in use, Earth satellites and other space vehicles are subjected to the effects of particle and quantum radiation. In the region of the radiation belt of the Earth, known as the van Allen belt, for example, a penetrating proton and electron radiation occurs. Transistors which are used in such space vehicles are particularly endangered by this radiation, since the electrical characteristics of the transistors are altered by the Ionization which occurs under the influence of the radiation. The current gain especially may decrease substantially under the influence of the radiation. Similar situations can occur also in the application of transistors in particle accelerators, nuclear reactors, X-ray installations and other installations where ionizing radiation is produced. In order to prevent too great an impairment of the functions of circuits equipped with the transistors, the transistors should have a radiation resistance as high as possible.

United States patent application Ser. No. 6,724, filed Jan. 29, 1970, now U.S. Pat. No. 3,691,376, proposes a method of increasing the radiation resistance of silicon transistors with a silicon oxide coating. This proposed method consists in the transistor being first exposed to an ionizing X-ray, gamma or electron radiation of such energy that the silicon oxide coating is penetrated by at least part of the radiation, and a dose between $10^4$ and $10^9$ rad. The transistor is subsequently subjected without irradiation to an electrical stress, under which a barrier layer temperature of about 50 to 250°C occurs. The sequence of irradiation and electrical stress without irradiation is repeated several times.

Although the proposed method produces good results, it is still relatively expensive because of the required repeated irradiation and electrical stressing without irradiation.

It is an object of our invention to provide a method of improving the radiation resistance of silicon transistors with a silicon oxide coating which is simpler, less expensive and more effective than proposed methods.

Another object of the invention is to provide a method of improving the radiation resistance of silicon transistors with a silicon oxide coating which requires only a single irradiation and is therefore more simple and better suited for inclusion in the manufacturing process of the transistors.

A further object of the invention is to improve the radiation resistance of silicon transistors with a silicon oxide coating by a method that may be applied at various stages of the manufacturing process.

Still another object of the invention is to improve the radiation resistance of silicon transistors with silicon oxide coating by irradiating completed transistors as well as silicon wafers including a multiplicity of transistor structures.

Another object of the invention is to improve the radiation resistance of oxide-coated silicon transistors by an irradiation method which is applicable to silicon wafers before or after the electrical contacts are applied to the transistor structures.

To achieve these objects, and in accordance with a feature of our invention, we subject a transistor, or a silicon wafer including several transistor structures, to electron radiation having an energy of less than 150 keV and a dose of between $10^9$ and $10^{12}$ rad at the boundary layer between the silicon and the silicon oxide coating; and we maintain the transistor or the silicon wafer at a temperature between 150° and 450°C during the irradiation.

The method of our invention has many advantages. As compared to the proposed method, it requires only a single irradiation and is therefore substantially simpler and better suited for inclusion in the manufacturing process of the transistors. Furthermore, the method of the invention may be included at various points of the manufacturing process, to the extent that the manufacturing process permits it. Completed transistors, with the case still appropriately open, may be irradiated as well as silicon wafers including a multiplicity of transistor structures not yet diced into individual transistor chips. The irradiation of such silicon wafers may occur before or after the electrical contacts are applied to the transistor structures.

It is known that in planar silicon transistors, the reduction in current gain which occurs through the influence of ionizing radiation of a lower radiation dose may in many cases be compensated for partially or even completely by heat treatment after the irradiation, or by electrical stress, particularly of the emitter-base junction of the transistor in the conducting direction. It is, however, completely surprising that ionization damage can be compensated for by exposure to radiation doses between $10^9$ and $10^{12}$ rad and simultaneous heating of the transistors to temperatures between 150° and 450°C, and that beyond this the radiation resistance of the transistors is substantially increased. While it was to be expected that at such high radiation doses the irradiated transistors or transistor structures would be damaged irrepairably, it was found, surprisingly, that with only the high radiation doses between $10^9$ and $10^{12}$ rad the radiation resistance of the transistors is particularly much improved. Especially advantageous radiation doses have been found to be between $5.10^9$ and $2.10^{10}$ rad.

The improvement of the radiation resistance of the transistors manifests itself particularly by the fact that the current gain of a transistor treated by the method of our invention drops in a radiation test only to a valve which is substantially higher than the value to which the current gain of the transistor drops in the same radiation test without treatment by the method of our invention. Current gain is understood herein to be the DC current gain, that is, the ratio of the collector current and the base current. This is the most important characteristic of a transistor.

The energy of the electron radiation to be used depends on the thickness of the silicon oxide coating of the transistor or the silicon wafer. The energy should be selected according to the well-known energy range relation in such a manner that the electron radiation penetrates through the silicon oxide coating into the boundary layer between the silicon oxide coating and the silicon. Electron radiation with an energy of more than 150 keV is not suitable, since with energies of such magnitude, radiation damage may occur in the interior of the silicon body of the transistor due to displacement of lattice atoms. With electron rays having an energy of less than 1 keV it will as a rule be no longer possible to penetrate the silicon oxide coating. The required radiation dose between $10^9$ and $10^{12}$ rad must be attained at the boundary layer between the silicon and the silicon oxide coating. It is highly probably that the increase in radiation resistance is caused by a reduction of the concentration of boundary surface states at this boundary layer due to the method of the invention.

In order to be able to retain the usual transistor mountings and leads when irradiating completed bipolar transistors, it is advantageous to heat the transistor to a temperature of only 150° to 300°C. Although there is an improvement of the radiation resistance obtained thereby in any event, there is a danger in some cases that the radiation damage caused by the irradiation is not completely compensated by the heat treatment, so that the transistor shows a somewhat smaller current gain after treatment than in the untreated condition. Complete compensating for the radiation damage may, however, be reliably achieved, even in this low temperature range, by applying an electric voltage in the conducting or forward direction between the emitter and base electrode terminals of the transistor simultaneously with the irradiation. This voltage should be as high as possible, but the maximum permissible value of the base current should not be exceeded.

If an electric voltage is additionally applied in the conducting direction between the collector and the base electrode terminals of the transistor, while not exceeding the maximum permissible values of the base and the collector currents, the properties of the collector-base junction, especially the breakdown voltage and the reverse current, may be favorably influenced toward compensating for radiation damage.

Temperatures of 200° to 250°C, in particular, have been found advantageous for the irradiation of bipolar transistors under simultaneous electrical stress.

It is advantageous to maintain the parts to be irradiated at a higher temperature between 300° and 400°C during irradiation, especially for the irradiation of silicon wafers having transistor structures which cannot be stressed electrically, or only at a very great expense in instrumentation.

After irradiation, these parts are annealed advantageously for at least ten hours at a temperature between 300° and 400°C in order to assure with reliability complete compensation for the radiation damage.

Even if the parts to be radiated, that is, the transistors or silicon wafers, are kept at a temperature of only between 200° and 250°C during irradiation, the parts can be annealed after irradiation, in lieu of an electrical stress during irradiation. The annealing is performed advantageously at a temperature between 300° and 350°C and lasts at least 10 hours.

The method of the invention is applicable particularly to planar silicon transistors of pnp as well as npn type, but is also suitable for other silicon transistors with silicon oxide coating such as, for example, MOS, or metal oxide silicon, field effect transistors.

In order that the invention may be readily carried into effect, it will now be described with reference to the accompanying drawings, wherein.

In the FIGS., the same components are identified by the same reference numerals.

As an example of a particularly advantageous form of execution of the method of the invention, the treatment of a silicon npn type planar transistor (Type BCY 59) is first described.

The transistor is first placed, with the case open, or without the can, respectively, into a plate mounting which may be heated or cooled, and which comprises a copper slab provided with holes for inserting the transistors. A good thermal contact between the transistors and the copper slab is assured by firmly pressing the base plate of the transistor housing against the copper slab. The copper slab is installed in the radiation chamber of an electron accelerator, which may be evacuated. The emitter, base and collector electrode leads of the transistor are brought out from the radiation chamber via vacuum-tight feedthroughs.

After the radiation chamber is evacuated down to a residual gas pressure of about $10^{-5}$ Torr, the transistor is irradiated with electrons having an energy of 25 keV and a beam current density of 1 $\mu A/cm^2$ for approximately 1.5 hours, until a radiation dose of approximately $10^{10}$ rad is reached at the boundary surface between the silicon and the silicon oxide. The radiation goes through the silicon oxide coating layer. The thickness of this coating is approximately 0.2 to 0.5 $\mu$.

During the irradiation, the transistor is kept at a temperature of about 220°C by heating the copper slab. An electric voltage of about 0.7 V in the conducting direction is applied simultaneously between the emitter and base electrode terminals and between the collector and base electrode terminals of the transistor, respectively. After an irradiation period of about 1.5 hours, the radiation is first discontinued. Then, the slab heat and the electrical stress of the transistor are discontinued and the copper slab is cooled to room temperature.

Figure 1:
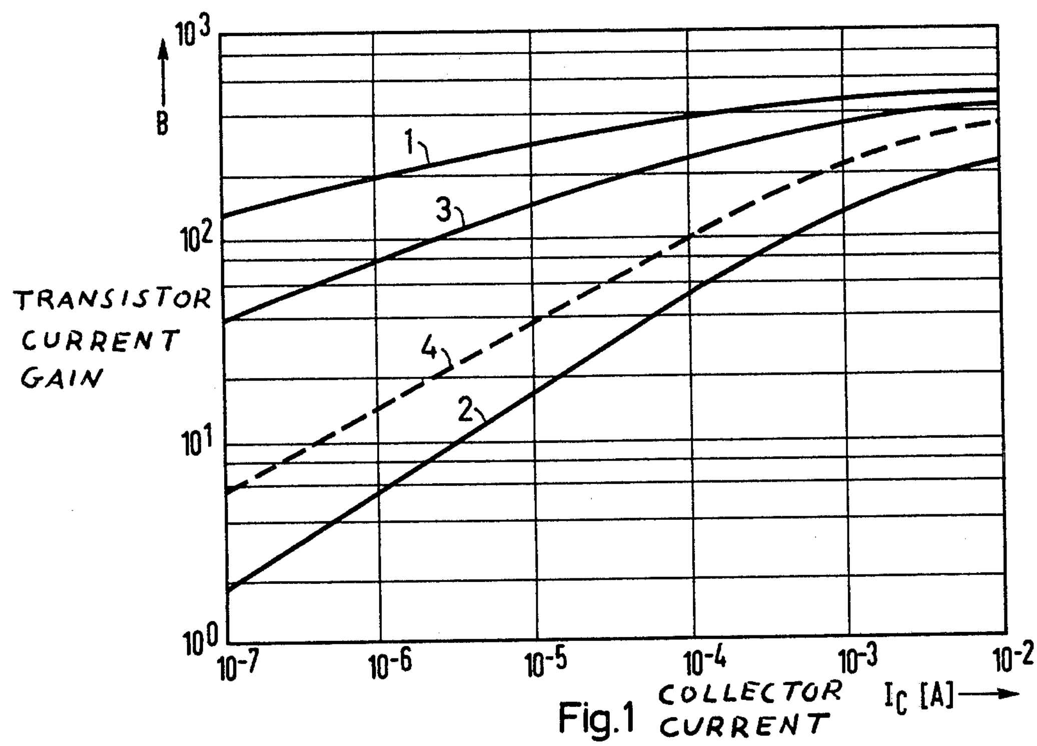
FIG. 1 is a graphical presentation of the current gain of planar silicon transistors as a function of the collector current before and after treatment by one embodiment of the method of the invention and after radiation tests.

The improved radiation resistance of the transistor is illustrated in FIG. 1. In FIG. 1, the abscissa represents the collector current $I_C$ in amps and the ordinate represents the transistor current gain B. Both the abscissa and ordinate are on a logarithmic scale. In order to determine curves 1 to 4, the current gain of a transistor is measured at different collector currents $I_C$. Before treatment by the embodiment of the method of the invention of the first example, the current gain of the transistor corresponds to Curve 1. A similar transistor not treated by the method of the invention was irradiated for comparison purposes in a radiation test with a dose of $10^7$ rad (electron radiation). In this case, the current gain dropped from Curve 1, which applied before the radiation test, to the values of Curve 2.

The transistor treated by the embodiment of the method of the invention of the first example had a current gain after treatment, which again corresponded to Curve 1. The original current gain was therefore not impaired by the treatment. This transistor was also subjected to a radiation test with a dose of $10^7$ rad. The current gain dropped here only to the values of Curve 3, and thus was higher by more than a factor of 10 after the radiation test than the current gain indicated by Curve 2 of the untreated transistor after the same radiation test, especially in the range of small collector currents between $10^{-7}$ and $10^{-6}$ amps.

Curve 4, shown as a broken line, presents for further comparison the current gain of a similar transistor which was first irradiated with electron radiation of a dose of about $10^{10}$ rad at room temperature and was heated to about 200°C and stressed electrically by the application of electrical voltages in the conduction direction between the emitter and base electrode terminals and the collector and base electrode terminals only after the irradiation. After such treatment, which deviates from the method of the invention, the transistor was also subjected to a radiation test with a dose of $10^7$ rad.

Although Curve 4 is above Curve 2, it is far below Curve 3. A comparison of Curves 3 and 4 shows the completely unexpected result that with simultaneous application of radiation, elevated temperature and electrical stress a substantially higher radiation resistance is obtained than with successive steps of irradiation on the one hand and the application of elevated temperature and electrical stress on the other hand. Curves 1 to 4 in FIG. 1 relate not only to measurements of single transistors, but were confirmed by investigations with many transistors. During all radiation tests, the transistor leads were short-circuited.

A second example of another embodiment of the method of the invention, without electrical stress, is hereinafter described. An npn type planar silicon transistor (Type BCY 59) is mounted in the radiation chamber of an electron accelerator in a manner similar to that described in the first example. However, the collector, base and emitter electrode leads are left open. The transistor is irradiated with electrons of 25 keV energy and a beam current density of 1 $\mu A/cm^2$ for about 1.5 hours, until at the boundary surface between the silicon and the silicon oxide coating a radiation dose of approximately $10^{10}$ rad is reached. During irradiation the transistor is kept on a temperature of 350°C. After the irradiation, the transistor is further annealed for about 50 hours at a temperature of approximately 350°C.

Figure 2:
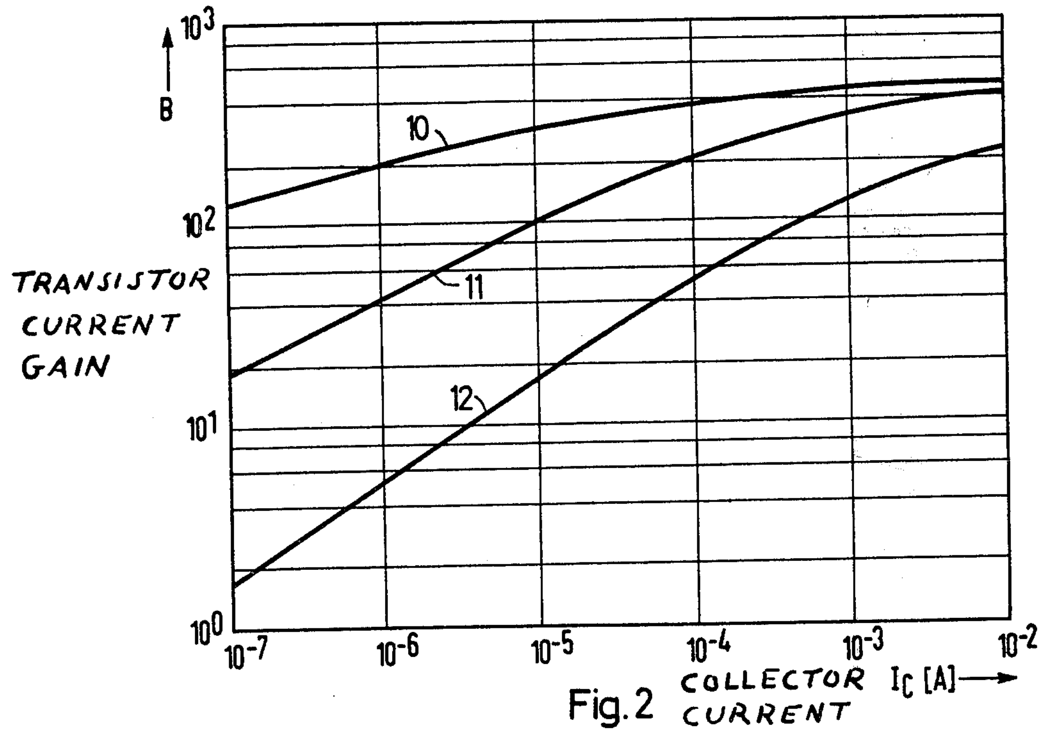
FIG. 2 is a graphical presentation of the current gain of planar silicon transistors as a function of the collector current before and after treatment by another embodiment of the method of the invention and after radiation tests.

The improvement of the radiation resistance of the transistor achieved by this treatment is illustrated in FIG. 2, in which the abscissa represents the collector current $I_C$ in amps and the ordinate represents the transistor current gain B. Both the abscissa and the ordinate are on a logarithmic scale.

Before and after the treatment by the embodiment of the method of the invention of the second example, the current gain of the transistor corresponds to Curve 10. The current gain is therefore not impaired by the treatment. The transistor is then subjected to a test radiation of $10^7$ rad. The current gain dropped from Curve 10 to the values of the Curve 11. For comparison purposes a similar transistor not treated by the method of the invention was subjected to a test radiation with a dose of $10^7$ rad. The current gain of this transistor dropped from Curve 10 to the values of the Curve 12. The embodiment of the method of the invention of the second example therefore provides a substantial improvement of the radiation resistance of the transistors. Curves 10, 11 and 12 were confirmed by measurements on several transistors.

Further investigations have shown that in comparable transistors, which showed a lower current gain in the non-irradiated condition than the transistors used in the first and second examples, it is possible to not only improve the radiation resistance by the method of the invention, but even to increase the current gain beyond the initial values.

Tests with pnp type planar silicon transistors yielded results similar to the tests with the npn type planar silicon transistors. Also, in radiation tests with other radiation doses, for example, of $10^6$ or $10^8$ rad, the substantial improvement of the radiation resistance of the transistors by the method of the invention was confirmed.

In irradiating silicon wafers which contain a multiplicity of transistor structures, the second example may be advantageously followed. The silicon wafers may be appropriately placed on the heated copper slab. The annealing after the irradiation, may, as in the case of completed transistors, also be performed in a suitable oven. The irradiation of silicon wafers has the particular advantage that a single performance of the method of the invention simultaneously handles a large number of transistors. The transistor structures may also be transistors in integrated circuits.

Figure 3:
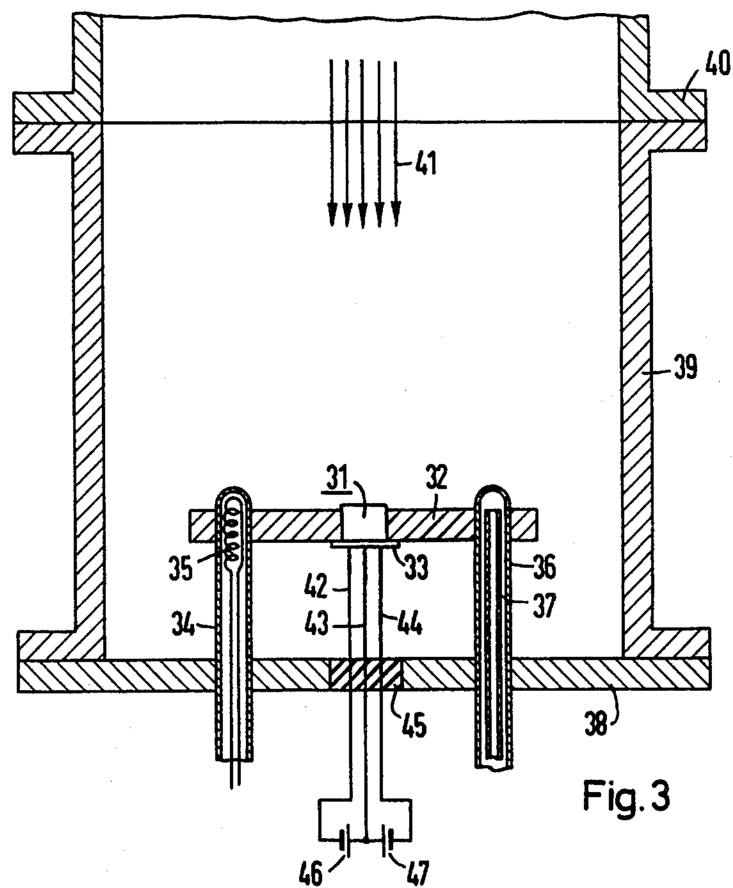
FIG. 3 is a sectional view of an embodiment of apparatus for carrying out the method of the invention.

FIG. 3 shows apparatus for carrying out the method of the invention. As hereinbefore explained in the first example, an npn type planar silicon transistor 31 having an open case is inserted into a mounting which consists of a copper slab 32 provided with a hole. The transistor case has a base plate 33 which is firmly pressed against the copper slab 32. A tube 34 serves to heat the copper slab 32. The tube 34 is inserted in the copper slab 32 and contains an electrically heatable heating coil 35.

A tube 36 serves to cool the copper slab 32. The tube 36 is inserted in the copper slab 32 and includes another tube 37 on the inside. A cooling medium such as, for example, air or water, may be fed through the inner tube 37, and may then flow off through the space between the tubes 36 and 37. At the same time, the tubes 34 and 36 function to fasten the copper slab 32 to a base plate 38 of a radiation chamber 39 of an electron accelerator.

The radiation chamber itself is connected to an end flange 40 of the electron accelerator. The electrons entering the radiation chamber 39 from the electron accelerator are shown schematically by arrows 41.

The transistor 31 has an emitter electrode lead 42, a base electrode lead 43 and a collector electrode lead 44 which are brought out of the radiation chamber 39 in a vacuum-tight manner by an insulating feed-through 45. A DC voltage provided by DC voltage sources 46 and 47 is applied in the conducting direction between the emitter electrode lead 42 and the base electrode lead 43, as well as between the collector electrode lead 44 and the base electrode lead 43, respectively.

Figure 4:
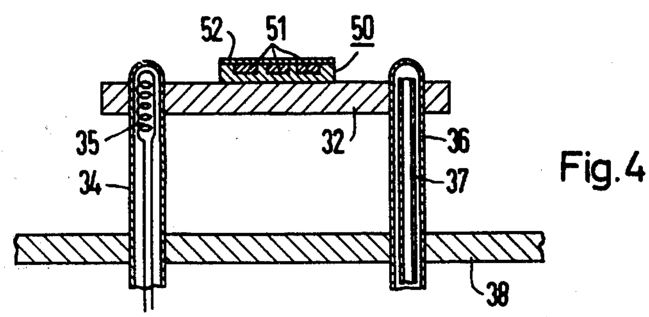
FIG. 4 is a sectional view of part of the apparatus of FIG. 3.

FIG. 4 shows part of the apparatus of FIG. 3 for the irradiation of a silicon wafer. A silicon wafer 50 is placed on the heatable copper slab 32. The transistor structures contained in the silicon wafer 50 are schematically indicated as 51. The schematically indicated silicon oxide coating is designated as 52.

While the invention has been described by means of specific examples and in specific embodiments, we do not wish to be limited thereto, for obvious modifications will occur to those skilled in the art without departing from the spirit and scope of the invention.

We claim:

1. A method of improving the radiation resistance of silicon transistors with a silicon oxide coating, comprising the steps of irradiating a semiconductor device having a silicon oxide coating with electrons at an energy below 150 keV and a dose between $10^9$ and $10^{12}$ rad at the boundary layer between the silicon and silicon oxide coating; and maintaining the temperature of the semiconductor device at a temperature of between 150° and 450°C during irradiation thereof.

2. A method as claimed in claim 1, wherein the radiation dose is between $5.10^9$ and $2.10^{10}$ rad.

3. A method as claimed in claim 1, wherein the semiconductor device is a silicon transistor.

4. A method as claimed in claim 1, wherein the semiconductor device is a silicon wafer including a plurality of transistor structures.

5. A method as claimed in claim 1, wherein the semiconductor device is maintained at a temperature of 300° to 400°C during irradiation thereof and is annealed for at least ten hours at a temperature between 300° and 400°C after the termination of irradiation.

6. A method as claimed in claim 1, wherein the semiconductor device is maintained at a temperature between 200° and 250°C during irradiation thereof and is annealed for at least 10 hours at a temperature between 300° and 350°C after the termination of irradiation.

* * * * *